US012507433B2

(12) United States Patent
Chen et al.

(10) Patent No.: US 12,507,433 B2
(45) Date of Patent: Dec. 23, 2025

(54) SEMICONDUCTOR DEVICE AND METHOD OF MANUFACTURING THE SAME

(71) Applicant: TAIWAN SEMICONDUCTOR MANUFACTURING COMPANY LTD., Hsinchu (TW)

(72) Inventors: Guan-Qi Chen, Kaohsiung (TW); Chen Chi Hsiao, Taipei (TW); Kun-Tsang Chuang, Miaoli County (TW); Fang Yi Liao, Tainan (TW); Yu Shan Hung, Tainan (TW); Chun-Chia Chen, Tainan (TW); Yu-Shan Huang, Kaohsiung (TW); Tung-I Lin, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 499 days.

(21) Appl. No.: 17/823,985

(22) Filed: Sep. 1, 2022

(65) Prior Publication Data
US 2024/0079493 A1    Mar. 7, 2024

(51) Int. Cl.
*H10D 30/65* (2025.01)
*H10D 30/01* (2025.01)
(Continued)

(52) U.S. Cl.
CPC ......... *H10D 30/65* (2025.01); *H10D 30/0281* (2025.01); *H10D 62/154* (2025.01); *H10D 62/158* (2025.01); *H10D 62/235* (2025.01)

(58) Field of Classification Search
CPC ............. H10D 30/0285; H10D 30/657; H10D 64/111; H10D 30/794; H10D 30/603; H10D 30/0221; H10D 30/0212; H10D 30/60; H10D 64/021; H10D 84/0128; H10D 84/013; H10D 84/038; H10D 84/83; H10D 30/65; H10D 30/0281; H10D 62/154; H10D 62/158; H10D 62/235; H10D 30/655;
(Continued)

(56) References Cited

U.S. PATENT DOCUMENTS 5,233,459 A * 8/1993 Bozler ............... G09F 9/372
359/227
6,412,237 B1 * 7/2002 Sahai ............... E04H 9/0237
52/690

(Continued)

*Primary Examiner* — Maliheh Malek
(74) *Attorney, Agent, or Firm* — WPAT LAW; Anthony King

(57) ABSTRACT

A semiconductor device and method of manufacturing the same are provided. The semiconductor device includes a substrate and a gate structure disposed on the substrate. The semiconductor device also includes a source region and a drain region disposed within the substrate. The substrate includes a drift region laterally extending between the source region and the drain region. The semiconductor device further includes a first stressor layer disposed over the drift region of the substrate. The first stressor layer is configured to apply a first stress to the drift region of the substrate. In addition, the semiconductor device includes a second stressor layer disposed on the first stressor layer. The second stressor layer is configured to apply a second stress to the drift region of the substrate, and the first stress is opposite to the second stress.

20 Claims, 13 Drawing Sheets

(51) Int. Cl.
*H10D 62/13* (2025.01)
*H10D 62/17* (2025.01)

(58) Field of Classification Search
CPC .. H10D 30/792; H10D 64/112; H10D 62/157; H10D 62/371; H10D 62/378
See application file for complete search history.

(56) References Cited

U.S. PATENT DOCUMENTS

| | | | | |
|---|---|---|---|---|
| 7,659,174 B2* | 2/2010 | Lee | | H10D 30/792 |
| | | | | 438/303 |
| 8,492,233 B2* | 7/2013 | Denison | | H10D 30/795 |
| | | | | 438/286 |
| 8,598,660 B2* | 12/2013 | Camillo-Castillo | | |
| | | | | H10D 30/0221 |
| | | | | 257/341 |
| 8,664,718 B2* | 3/2014 | Cheng | | H10D 64/111 |
| | | | | 257/E29.256 |
| 9,698,260 B1* | 7/2017 | Zhang | | H10D 30/0285 |
| 10,756,208 B2* | 8/2020 | Lu | | H10D 30/65 |
| 11,588,040 B2* | 2/2023 | Liu | | H10D 64/111 |
| 12,166,108 B2* | 12/2024 | Hung | | H10D 30/657 |
| 2003/0111699 A1* | 6/2003 | Wasshuber | | H01L 21/76283 |
| | | | | 257/414 |
| 2007/0056380 A1* | 3/2007 | Chan | | G01R 31/2648 |
| | | | | 73/775 |
| 2008/0026523 A1* | 1/2008 | Lee | | H10D 84/0184 |
| | | | | 438/231 |
| 2008/0050868 A1* | 2/2008 | Lee | | H10D 30/792 |
| | | | | 257/E21.632 |
| 2009/0142918 A1* | 6/2009 | Liu | | H10B 20/60 |
| | | | | 438/627 |
| 2012/0306014 A1* | 12/2012 | Camillo-Castillo | | |
| | | | | H10D 30/022 |
| | | | | 257/E29.256 |
| 2012/0313161 A1* | 12/2012 | Grivna | | H10D 30/63 |
| | | | | 438/270 |
| 2013/0020632 A1* | 1/2013 | Disney | | H10D 30/0285 |
| | | | | 257/E21.409 |
| 2013/0039664 A1* | 2/2013 | Clifton | | H01S 5/3224 |
| | | | | 438/94 |
| 2013/0134512 A1* | 5/2013 | Cheng | | H10D 64/111 |
| | | | | 257/E29.256 |
| 2013/0277741 A1* | 10/2013 | Guowei | | H10D 30/603 |
| | | | | 257/E29.256 |
| 2014/0198825 A1* | 7/2014 | Tsai | | H01L 21/02639 |
| | | | | 374/178 |
| 2016/0149007 A1* | 5/2016 | Chou | | H10D 64/111 |
| | | | | 257/339 |
| 2017/0194488 A1* | 7/2017 | Gao | | H10D 64/112 |
| 2018/0246226 A1* | 8/2018 | Ota | | G01T 1/185 |
| 2019/0088777 A1* | 3/2019 | Lu | | H10D 30/603 |
| 2019/0288066 A1* | 9/2019 | Lee | | H10D 30/0221 |
| 2019/0305754 A1* | 10/2019 | Fang | | H03H 9/0547 |
| 2020/0144414 A1* | 5/2020 | Zhang | | H10D 62/393 |
| 2021/0028299 A1* | 1/2021 | Liu | | H10D 30/65 |
| 2022/0014166 A1* | 1/2022 | Fattinger | | H03H 9/02015 |
| 2022/0045213 A1* | 2/2022 | Bellini | | H10D 30/791 |
| 2022/0384290 A1* | 12/2022 | Lee | | H01L 21/56 |
| 2022/0406937 A1* | 12/2022 | Karner | | H10D 30/668 |
| 2023/0023179 A1* | 1/2023 | Ji | | H10D 30/65 |
| 2023/0246081 A1* | 8/2023 | Lin | | H10D 64/01 |
| | | | | 257/339 |
| 2023/0317846 A1* | 10/2023 | Naquin | | H10D 30/655 |
| | | | | 257/288 |
| 2023/0378324 A1* | 11/2023 | Hung | | H10D 30/0285 |
| 2024/0145553 A1* | 5/2024 | Koshimizu | | H10D 30/65 |
| 2024/0162304 A1* | 5/2024 | Fisher | | H10D 62/8503 |
| 2024/0429120 A1* | 12/2024 | Schuette | | H10D 62/8503 |
| 2025/0063750 A1* | 2/2025 | Hung | | H10D 84/038 |

\* cited by examiner

SEMICONDUCTOR DEVICE AND METHOD OF MANUFACTURING THE SAME

BACKGROUND

Technological advances in semiconductor integrated circuit (IC) materials, design, processing, and manufacturing have enabled the continual reduction in size of IC devices, where each generation has smaller and more complex circuits than the previous generation.

As semiconductor circuits composed of devices such as metal-oxide-semiconductor field-effect transistors (MOSFETs) are adapted for high voltage applications, such as in lateral diffusion metal-oxide-semiconductor (LDMOS) devices, problems arise with respect to decreasing voltage performance as the downscaling continues with advanced technologies. To improve the mobility of carriers in a drift region of the LDMOS, a new semiconductor device is required.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
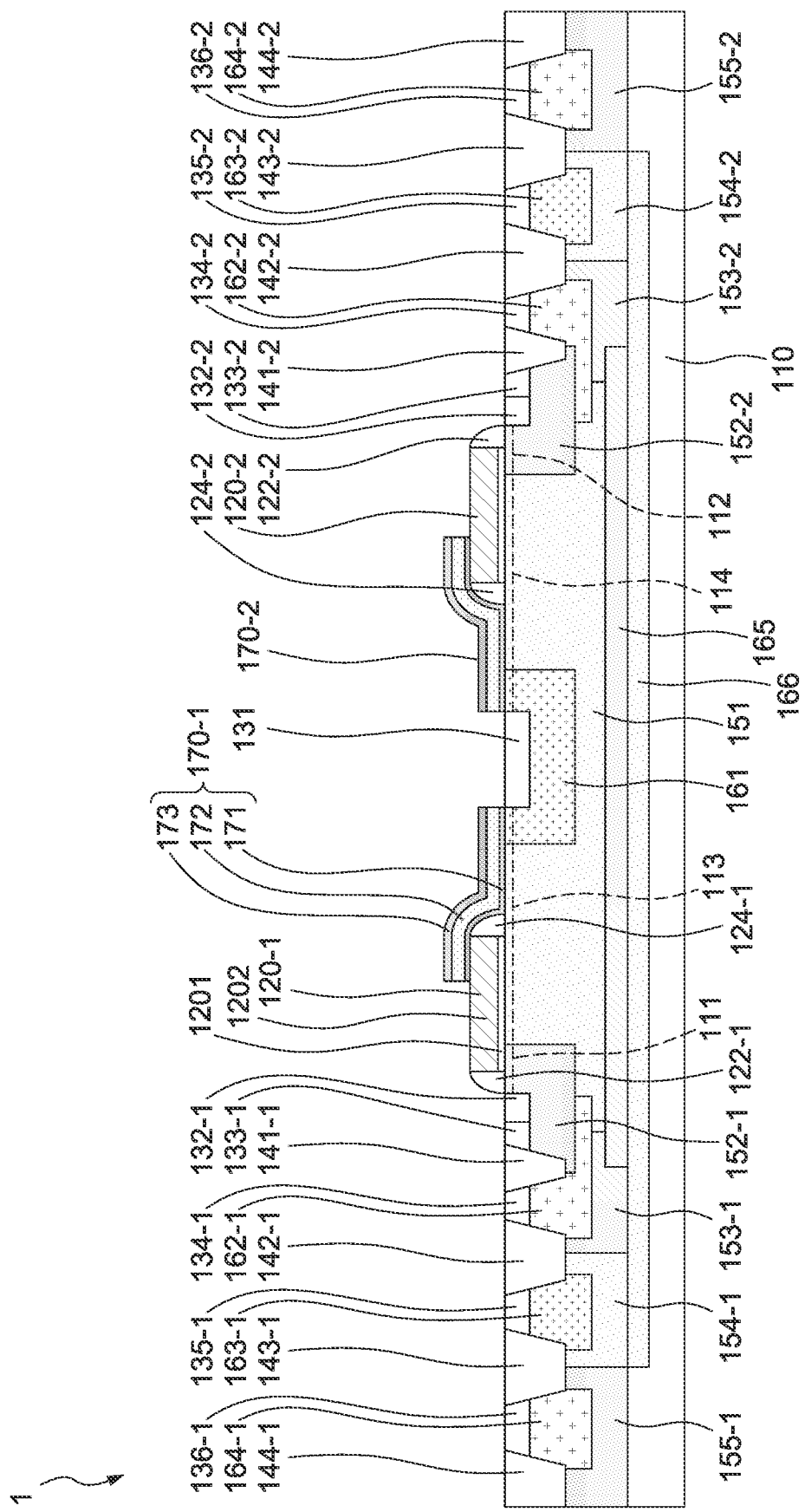
FIG. 1 illustrates a cross-sectional view of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may be also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and the attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In some embodiments, semiconductor devices 1, 2a, 2b, and 2c are provided. Each of the semiconductor devices 1, 2a, 2b, and 2c can be a high voltage semiconductor device. Each of the semiconductor devices 1, 2a, 2b, and 2c can be an n type high-voltage device, but the disclosure is not limited thereto. In some embodiments, each of the semiconductor devices 1, 2a, 2b, and 2c can be referred to as a laterally-diffused MOS (LDMOS) transistor device, a high-voltage laterally-diffused MOS (HV LDMOS) transistor device, a high-voltage extended-drain MOS (HV EDMOS) transistor device, or any other device.

FIG. 1 illustrates a cross-sectional view of a semiconductor device 1, in accordance with some embodiments of the present disclosure.

In some embodiments, the semiconductor device 1 includes a substrate 110. The substrate 110 may be a semiconductor substrate, such as a bulk semiconductor, a semiconductor-on-insulator (SOI) substrate, or the like, which may be doped (e.g., with a p type or an n type dopant) or undoped. The substrate 110 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable material; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 110 may have a multilayer structure, or the substrate 110 may include a multilayer compound semiconductor structure.

In some embodiments, the semiconductor device 1 includes gate structures 120-1 and 120-2. Each of the gate structures 120-1 and 120-2 is disposed on the substrate 110. Each of the gate structures 120-1 and 120-2 includes a gate dielectric 1201 and a gate electrode 1202.

The gate dielectric 1201 may have a single layer or a multi-layer structure. In some embodiments, the gate dielectric 1201 is a multi-layer structure that includes an interfacial layer and a high-k (dielectric constant greater than 4) dielectric layer. The interfacial layer can include dielectric material such as silicon oxide, silicon nitride, silicon oxynitride, other dielectric material, or a combination thereof. The high-k dielectric layer can include high-k dielectric material such as $HfO_2$, HfSiO, HfSiON, HfTaO, HfTiO, HfZrO, other suitable high-k dielectric materials, or a combination thereof. In some embodiments, the high-k dielectric material can further be selected from metal oxides, metal nitrides, metal silicates, transition metal-oxides, transition metal-nitrides, transition-metal silicates, metal oxynitrides, metal aluminates, and combinations thereof.

The gate electrode 1202 is disposed on the gate dielectric 1201. The gate electrode 1202 can include polysilicon, silicon-germanium, and at least one metallic material including elements and compounds such as Mo, Cu, W, Ti, Ta, TiN, TaN, NiSi, CoSi, or other suitable conductive materials known in the art. In some embodiments, the gate electrode 1202 includes a work function metal layer that provides a metal gate with an n type-metal work function or p type-metal work function. The p type-metal work function materials include materials such as ruthenium, palladium, platinum, cobalt, nickel, conductive metal oxide, or other suitable materials. The n type-metal work function materials include materials such as hafnium zirconium, titanium, tantalum, aluminum, metal carbides (e.g., hafnium carbide, zirconium carbide, titanium carbide, and aluminum carbide), aluminides, or other suitable materials.

In some embodiments, the semiconductor device 1 includes spacers 122-1 and 124-1. The spacers 122-1 and 124-1 are disposed on two opposite sides of the gate structure 120-1. Each of the spacers 122-1 and 124-1 includes a single layer structure or a multilayered structure. Each of the spacers 122-1 and 124-1 includes silicon oxide, silicon nitride, silicon oxynitride, other dielectric material, or a combination thereof.

In some embodiments, the semiconductor device 1 includes spacers 122-2 and 124-2. The spacers 122-2 and 124-2 are disposed on two opposite sides of the gate structure 120-2. Each of the spacers 122-2 and 124-2 includes a single layer structure or a multilayered structure.

In some embodiments, the semiconductor device 1 includes doped regions 131, 132-1, 133-1, 134-1, 132-2, 133-2, and 134-2. The doped region 131 may be disposed within the substrate 110. In some embodiments, the doped region 131 is disposed between the gate structures 120-1 and 120-2. In some embodiments, the doped region 131 may have a first conductive type. In some embodiments, the first conductive type is an n type. In some embodiments, n type dopants include arsenic (As), phosphorus (P), other group V elements, or any combination thereof. In some embodiments, the first conductive type is a p type. In some embodiments, p type dopants include boron (B), other group III elements, or any combination thereof. In some embodiments, the doped region 131 may serve as a common drain.

The doped region 132-1 may be disposed within the substrate 110. The doped regions 132-1 and 131 may be disposed on two opposite sides of the gate structure 120-1. The doped region 132-1 may have the first conductive type. The doped region 133-1 may be disposed within the substrate 110. The doped region 133-1 may be disposed adjacent to the doped region 132-1. In some embodiments, the doped region 133-1 may be in contact with the doped region 132-1. The doped region 133-1 may have a second conductive type different from the first conductive type. The doped region 134-1 may be disposed within the substrate 110. The doped region 134-1 may be spaced apart from the doped region 133-1 by an isolation structure 141-1. In some embodiments, the doped region 134-1 may have the second conductive type. In some embodiments, the doped regions 132-1, 133-1, and 134-1 may be electrically connected to the same voltage supply and serve as a butted source.

The doped region 132-2 may be disposed within the substrate 110. The doped regions 132-2 and 131 may be disposed on two opposite sides of the gate structure 120-2. The doped region 132-2 may have the first conductive type. The doped region 133-2 may be disposed within the substrate 110. The doped region 133-2 may be disposed adjacent to the doped region 132-2. In some embodiments, the doped region 133-2 may be in contact with the doped region 132-2. The doped region 133-2 may have the second conductive type. The doped region 134-2 may be disposed within the substrate 110. The doped region 134-2 may be spaced apart from the doped region 133-2 by an isolation structure 141-2. In some embodiments, the doped region 134-2 may have the second conductive type. In some embodiments, the doped regions 132-2, 133-2, and 134-2 may be electrically connected to the same voltage supply and serve as a butted source.

In some embodiments, the semiconductor device 1 includes doped regions 135-1 and 135-2. The doped region 135-1 may be disposed within the substrate 110. The doped region 135-1 may be spaced apart from the doped region 134-1 by an isolation structure 142-1. The doped region 135-1 may have the first conductive type. The doped region 135-2 may be disposed within the substrate 110. The doped region 135-2 may be spaced apart from the doped region 134-2 by an isolation structure 142-2. The doped region 135-2 may have the first conductive type. In some embodiments, each of the doped regions 135-1 and 135-2 may be configured to protect the semiconductor device 1 such that a greater voltage can be imposed on the semiconductor device 1.

In some embodiments, the semiconductor device 1 includes doped regions 136-1 and 136-2. The doped region 136-1 may be disposed within the substrate 110. The doped region 136-1 may be spaced apart from the doped region 135-1 by an isolation structure 143-1. The doped region 136-1 may have the second conductive type. The doped region 136-2 may be disposed within the substrate 110. The doped region 136-2 may be spaced apart from the doped region 135-2 by an isolation structure 143-2. The doped region 136-2 may have the second conductive type. In some embodiments, each of the doped regions 136-1 and 136-2 may be configured to electrically connect to ground.

In some embodiments, the semiconductor device 1 further includes isolation structures 144-1 and 144-2. Each of the isolation structures 141-1, 142-1, 143-1, 144-1, 141-2, 142-2, 143-2, and 144-2 may be disposed within the substrate 110 and spaced apart from each other. In some embodiments, each of the isolation structures 141-1, 142-1, 143-1, 144-1, 141-2, 142-2, 143-2, and 144-2 is a shallow trench isolation (STI), as shown in FIG. 1. In other embodiments, the isolation structures 141-1, 142-1, 143-1, 144-1, 141-2, 142-2, 143-2, and 144-2 may include a structure of a local oxidization of silicon (LOCOS) structure, or any other suitable isolation structure.

In some embodiments, the semiconductor device 1 includes a well region 151. The well region 151 has the first conductive type. The doped region 131 may be disposed within the well region 151. In some embodiments, the well region 151 can be referred to as a high-voltage n type well (HVNW) or a high-voltage p type well (HVPW).

In some embodiments, the semiconductor device 1 includes well regions 152-1 and 152-2. Each of the well regions 152-1 and 152-2 has the second conductive type. In some embodiments, each of the well regions 152-1 and 152-2 is partially disposed within the well region 151. The doped regions 132-1 and 133-1 are disposed within the well region 152-1. The doped regions 132-2 and 133-2 are disposed within the well region 152-2. In some embodiments, each of the well regions 152-1 and 152-2 can be referred to as a high-voltage p type well (HVPW) or a high-voltage n type well (HVNW).

In some embodiments, the well region 152-1 may define a channel region 111 laterally extending between the doped regions 132-1 and 131. In some embodiments, the well region 152-2 may define a channel region 112 laterally extending between the doped region 132-2 and the doped region 131. In some embodiments, the well region 151 may define a drift region 113 laterally extending between the doped regions 132-1 and 131. In some embodiments, the well region 151 may define a drift region 114 laterally extending between the doped region 132-2 and the doped region 131. During operation, a gate-source voltage (VGs) can be selectively applied to the gate structure 120-1 (or 120-2) relative to the doped region 132-1 (or 132-2), forming a conductive channel in the channel region 111 (or 112). While VGs is applied to form the conductive channel, a drain to source voltage (V D s) is applied to move charge carriers (e.g., holes or electrons) between the doped region 132-1 and 131 (or between 132-2 and 131). The channel region 111 (or 112) laterally extends from the doped region 132-1 (or 132-2) to an adjacent drift region 113. The drift region 113 (or 114) has a relatively low doping concentration, which provides for a higher resistance at high operating voltages. The gate structure 120-1 is disposed over the channel region 111. In some embodiments, the gate structure 120-1 may extend from over the channel region 111 to a position overlying a portion of the drift region 113. The gate structure 120-2 is disposed over the channel region 112. In some embodiments, the gate structure 120-2 may extend from over the channel region 112 to a position overlying a portion of the drift region 114.

In some embodiments, the semiconductor device 1 includes well regions 153-1 and 153-2. Each of the well regions 153-1 and 153-2 may be disposed adjacent to the well region 151. Each of the well regions 153-1 and 153-2 has the second conductive type. In some embodiments, the doped region 134-1 is disposed within the well region 153-1. In some embodiments, the doped region 134-2 is disposed within the well region 153-2. In some embodiments, each of the well regions 153-1 and 153-2 can be referred to as a high-voltage p type well (HVPW) or a high-voltage n type well (HVNW).

In some embodiments, the semiconductor device 1 includes well regions 154-1 and 154-2. Each of the well regions 154-1 and 154-2 has the first conductive type. In some embodiments, the doped region 135-1 is disposed within the well region 154-1. In some embodiments, the doped region 135-2 is disposed within the well region 154-2. In some embodiments, each of the well regions 154-1 and 154-2 can be referred to as a high-voltage n type well (HVNW) or a high-voltage p type well (HVPW).

In some embodiments, the semiconductor device 1 includes well regions 155-1 and 155-2. Each of the well regions 155-1 and 155-2 has the second conductive type. In some embodiments, the doped region 136-1 is disposed within the well region 155-1. In some embodiments, the doped region 136-2 is disposed within the well region 155-2. In some embodiments, each of the well regions 155-1 and 155-2 can be referred to as a high-voltage p type well (HVPW) or a high-voltage n type well (HVNW).

In some embodiments, the semiconductor device 1 includes a well region 161. The well region 161 may be disposed within the well region 151. The doped region 131 may be disposed within the well region 161. The well region 161 may have the first conductive type. In some embodiments, the well region 161 can be referred to as a shallow n-well region or a shallow p-well region.

In some embodiments, the semiconductor device 1 includes well regions 162-1 and 162-2. The well region 162-1 is partially disposed within the well region 151. The well region 162-1 is partially disposed within the well region 153-1. The well region 162-2 is partially disposed within the well region 151. The well region 162-2 is partially disposed within the well region 153-2. Each of the well regions 162-1 and 162-2 has the second conductive type. In some embodiments, each of the well regions 162-1 and 162-2 can be referred to as a shallow p-well region or a shallow n-well region.

In some embodiments, the semiconductor device 1 includes well regions 163-1 and 163-2. The well region 163-1 is disposed within the well region 154-1. The well region 163-2 is partially disposed within the well region 154-2. Each of the well regions 163-1 and 163-2 has the first conductive type. In some embodiments, each of the well regions 163-1 and 163-2 can be referred to as a shallow n-well region or a shallow p-well region.

In some embodiments, the semiconductor device 1 includes well regions 164-1 and 164-2. The well region 164-1 is disposed within the well region 155-1. The well region 164-2 is partially disposed within the well region 155-2. Each of the well regions 164-1 and 164-2 has the second conductive type. In some embodiments, each of the well regions 164-1 and 164-2 can be referred to as a shallow p-well region or a shallow n-well region.

In some embodiments, the semiconductor device 1 includes a well region 165. The well region 165 is disposed under the well region 151. The well region 165 has the second conductive type. In some embodiments, the well region 165 can be referred to as a deep p-well region or a deep n-well region.

In some embodiments, the semiconductor device 1 includes a doped region 166. The doped region 166 is disposed under the well region 165. The doped region 166 has the first conductive type. In some embodiments, the doped region 166 can be referred to as an n type buried layer or a p type buried layer.

In some embodiments, the semiconductor device 1 includes stressor structures 170-1 and 170-2. The stressor structure 170-1 may be disposed on the gate structure 120-1. The stressor structure 170-1 may be disposed on the substrate 110. In some embodiments, the stressor structure 170-1 covers a portion of the drift region 113. The stressor structure 170-2 may be disposed on the gate structure 120-2. The stressor structure 170-2 may be disposed on the substrate 110. In some embodiments, the stressor structure 170-2 covers a portion of the drift region 114. In some embodiments, each of the stressor structures 170-1 and 170-2 is configured to apply a stress to the drift region 113 (or 114) to control, modify, and/or adjust the mobility of carriers, such as holes or electrons.

In some embodiments, each of the stressor structures 170-1 and 170-2 has a stressor layer 171, a buffer layer 172, and a stressor layer 173. The stressor layer 171 is disposed over the drift region 113 (or 114). The stressor layer 171 covers a portion of the gate structure (e.g., 120-1). The stressor layer 171 covers a portion of the spacer (e.g., 124-1). The stressor layer 171 covers a portion of the drift region 113 (or 114). In some embodiments, the stressor layer 171 is configured to apply a first stress to the drift region 113 (or 114). In some embodiments, the stressor layer 171 includes dielectric materials, such as silicon nitride, silicon oxide, silicon oxynitride, or other dielectric materials.

In some embodiments, the buffer layer 172 is conformally disposed on the stressor layer 171. The buffer layer 172 is disposed between the stressor layers 171 and 173. In some embodiments, the buffer layer 172 is configured to prevent the semiconductor device 1 from cracking and/or delamination during semiconductor manufacturing processes. In some embodiments, the material of the buffer layer 172 is different from that of the stressor layer 171. The buffer layer 172 includes dielectric materials, such as silicon oxide, silicon nitride, silicon oxynitride, or other dielectric materials.

In some embodiments, the stressor layer 173 is conformally disposed on the buffer layer 172. In some embodiments, the stressor layer 173 is conformally disposed on the stressor layer 171. In some embodiments, the stressor layer 173 is configured to apply a second stress to the drift region 113 (or 114). The second stress is opposite to the first stress. In some embodiments, the first stress is tensile stress, and the second stress is compressive stress. In some embodiments, the first stress is compressive stress, and the second stress is tensile stress. The stressor layer 173 includes dielectric materials, such as silicon nitride, silicon oxide, silicon oxynitride, or other dielectric materials. In some embodiments, the material of the stressor layer 173 is different from that of the buffer layer 172. In some embodiments, the material of the stressor layer 173 is different from that of the stressor layer 171. In some embodiments, the material of the stressor layer 173 is the same as that of the stressor layer 171 with different densities. In some embodiments, the density of the stressor layer 173 is greater than that of the stressor layer 171. In some embodiments, the density of the stressor layer 173 is less than that of the stressor layer 171. The stress imposed by the stressor layer 171 and/or 173 can be identified by a Raman spectrum. For example, when a stressor layer imposes a compressive stress to an underlying layer, the peak of the wave number of said stressor layer will shift to a higher value in a Raman spectrum. When the materials of the stressor layers 171 and 173 are the same, the peak of the wave number of the stressor layer 171 is different from that of the stressor layer 173 in a Raman spectrum.

In a comparative semiconductor device, one or more stressor layers are disposed on the substrate and impose a compressive or a tensile stress to a drift region of the substrate. However, the comparative semiconductor device can only improve the mobility of a single type of semiconductor device, such as a PMOS or NMOS device. In comparison with the comparative semiconductor device, the semiconductor device 1 has a pair of stressor layers which impose reverse stresses to the drift region of the substrate. Further, the stress structure (e.g., 170-1 or 170-2) can be applied to enhance the mobility of both PMOS and NMOS devices. As a result, the electrical properties of the semiconductor device 1 is improved while the breakdown voltage can be maintained at the same level.

Figure 2A:
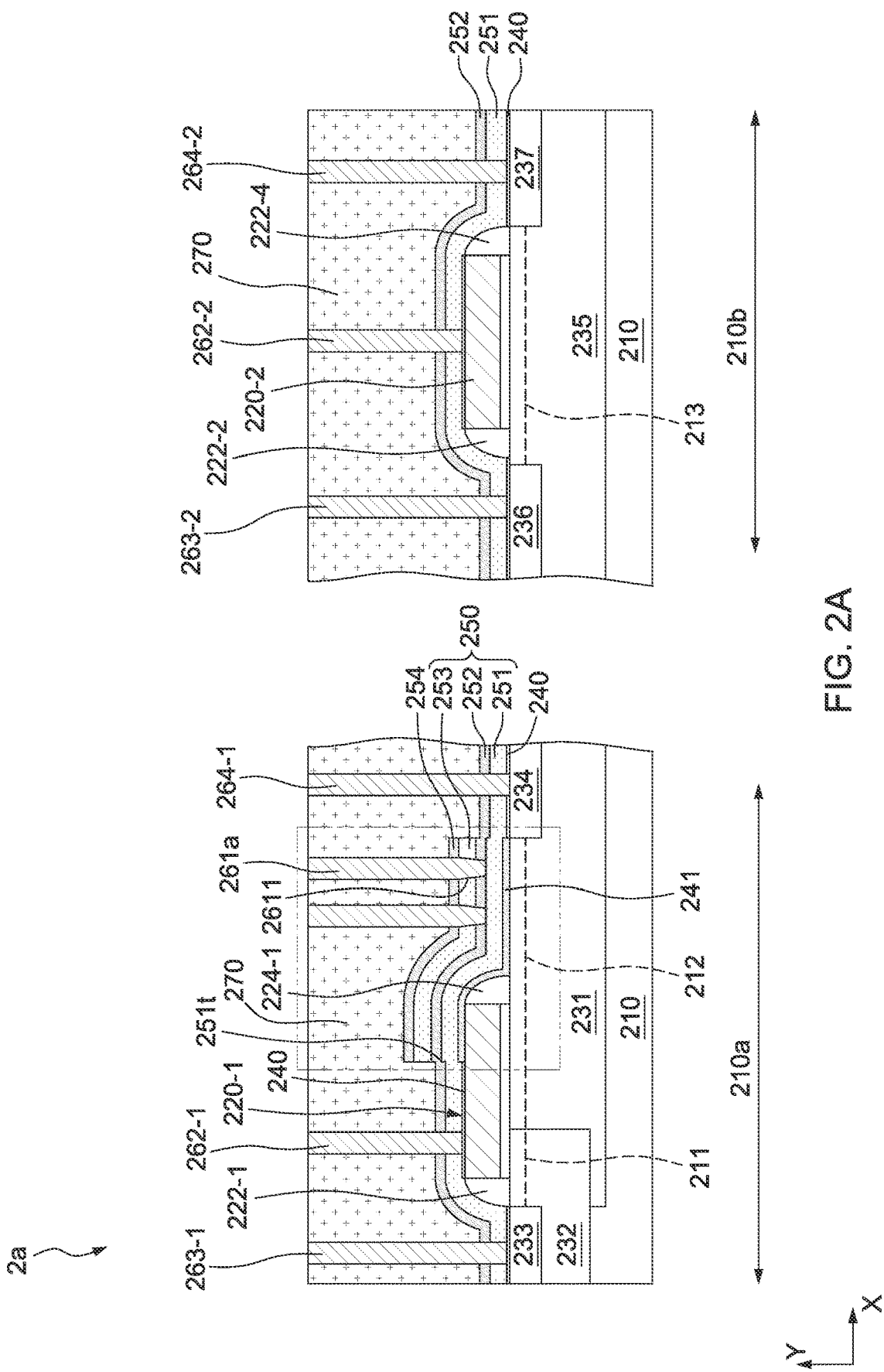
FIG. 2A illustrates a cross-sectional view of a semiconductor device, in accordance with some embodiments of the present disclosure.

FIG. 2A illustrates a cross-sectional view of a semiconductor device 2a, in accordance with some embodiments of the present disclosure.

In some embodiments, the semiconductor device 2a includes a substrate 210. The substrate 210 has regions 210a and 210b. The region 210a may correspond to a region on which an LDMOS device is formed. The region 210b may correspond to a region on which a logic device is formed. It should be noted that some features and/or elements are omitted in FIG. 2A for brevity. For example, the substrate 210 may include more doped regions and/or well regions to meet design requirements.

In some embodiments, the semiconductor device 2a includes gate structures 220-1 and 220-2. The gate structure 220-1 is disposed on the region 210a of the substrate 210. The gate structure 220-2 is disposed on the region 210b of the substrate 210. Each of the gate structures 220-1 and 220-2 may be similar to or the same as that of the gate structure 120-1.

In some embodiments, the semiconductor device 2a includes spacers 222-1, 222-2, 224-1, and 224-2. The spacers 222-1 and 224-1 are disposed on two opposite sides of the gate structure 220-1. The spacers 222-2 and 224-2 are disposed on two opposite sides of the gate structure 220-2.

In some embodiments, the semiconductor device 2a includes well regions 231 and 232 as well as doped regions 233 and 234. The well region 231 is disposed within the region 210a of the substrate 210. The region 210a may have the first conductive type. In some embodiments, the well region 231 can be referred to as a high-voltage n type well (HVNW) or a high-voltage p type well (HVPW).

The well region 232 is disposed within the region 210a of the substrate 210. The well region 232 is partially disposed within the well region 231. The well region 232 has the second conductive type. In some embodiments, the well region 232 can be referred to as a high-voltage p type well (HVPW) or a high-voltage n type well (HVNW).

The doped regions 233 and 234 are disposed within the region 210a of the substrate 210. The doped regions 233 and 234 are disposed on two opposite sides of the gate structure 220-1. Each of the doped regions 233 and 234 has the first conductive type. The doped region 233 can serve as, for example, a source region, and the doped region 234 can serve as, for example, a drain region.

In some embodiments, the well region 232 may define a channel region 211 laterally extending between the doped regions 233 and 234. In some embodiments, the well region 231 may define a drift region 212 laterally extending between the doped regions 233 and 234.

In some embodiments, the semiconductor device 2a includes a well region 235, a doped region 236 and a doped region 237. The well region 235 is disposed within the region 210b of the substrate 210. The well region 235 has the second conductive type.

The doped regions 236 and 237 are disposed within the region 210b of the substrate 210. The doped regions 236 and 237 are disposed on two opposite sides of the gate structure 220-2. Each of the doped regions 236 and 237 has the first conductive type. The doped region 236 can serve as, for example, a source region, and the doped region 237 can serve as, for example, a drain region.

In some embodiments, the well region 235 may define a channel region 213 laterally extending between the doped regions 233 and 234.

In some embodiments, the semiconductor device 2a includes a silicide layer 240. The silicide layer 240 is disposed on the gate structure 220-1. The silicide layer 240 is disposed on the gate structure 220-2. The silicide layer 240 is disposed on the substrate 210. In some embodiments, a portion of the drift region 212 is not covered by the silicide layer 240. The silicide layer 240 includes NiSi, PtSi, TiSi or any suitable metal silicide material. The silicide layer 240 is configured to reduce the metal-silicon contact resistivity by employing different metals and/or co-implants at the silicon-contact interface in order to reduce the Schottky barrier height.

In some embodiments, the semiconductor device 2a includes a silicide blocking layer 241. The silicide blocking layer 241 may be disposed on the region 210a of the substrate 210. In some embodiments, the silicide blocking layer 241 may be a resist-protection oxide (RPO) layer configured to prevent silicide formation. The silicide blocking layer 241 may be arranged over portions of the gate structure 220-1 and the drift region 212. In some embodiments, the silicide blocking layer 241 continuously extends from over the gate structure 220-1 to over the drift region 212.

In some embodiments, the semiconductor device 2a includes a stressor structure 250. In some embodiments, the stressor structure 250 is disposed on the region 210a of the substrate 210. In some embodiments, the stressor structure 250 is configured to apply a stress to the drift region 212 to control, modify, and/or adjust the mobility of carriers, such as holes or electrons.

In some embodiments, the stressor structure 250 has a stressor layer 251, a buffer layer 252, and a stressor layer 253. In some embodiments, the stressor layer 251 is disposed over the drift region 212. The stressor layer 251 is conformally disposed on the silicide layer 240. The stressor layer 251 is conformally disposed on the silicide blocking layer 241. In some embodiments, the stressor layer 251 is configured to apply a first stress to the drift region 212. The material of the stressor layer 251 may be the same as or similar to that of the stressor layer 171. In some embodiments, the stressor layer 251 may cover the region 210a of the substrate 210. In some embodiments, the stressor layer 251 may cover the region 210b of the substrate 210. In some embodiments, the stressor layer 251 may cover a portion of the gate structure 220-1. In some embodiments, the stressor layer 251 may cover the gate structure 220-2. In some embodiments, the stressor layer 251 has a step structure 251t over the gate structure 220-1.

In some embodiments, the buffer layer 252 is conformally disposed on the stressor layer 251. The buffer layer 252 is disposed between the stressor layers 251 and 253. The material of the buffer layer 252 may be the same as or similar to that of the buffer layer 172. In some embodiments, the buffer layer 252 may cover the region 210a of the substrate 210. In some embodiments, the buffer layer 252 may cover the region 210b of the substrate 210. In some embodiments, the buffer layer 252 may cover the gate structure 220-1. In some embodiments, the buffer layer 252 may cover the gate structure 220-2.

In some embodiments, the stressor layer 253 is conformally disposed on the buffer layer 252. In some embodiments, the stressor layer 253 is conformally disposed on the stressor layer 251. In some embodiments, the stressor layer 253 is configured to apply a second stress to the drift region 212. The second stress is opposite to the first stress. In some embodiments, the first stress is tensile stress, and the second stress is compressive stress. In some embodiments, the first stress is compressive stress, and the second stress is tensile stress. The material of the stressor layer 253 may be the same as or similar to that of the stressor layer 173. In some embodiments, the stressor layer 253 may cover the region 210a of the substrate 210. In some embodiments, the region 210b of the substrate 210 is not covered by the stressor layer 253. In some embodiments, the stressor layer 253 may cover a portion of the gate structure 220-1. In some embodiments, the gate structure 220-2 is not covered by the stressor layer 253.

The semiconductor device 2a has a pair of stressor layers which impose reverse stresses to the drift region 212 of the substrate 210. As a result, the electrical properties of the region 210b of the semiconductor device 2a is improved while the breakdown voltage can be maintained at the same level. Further, the stressor layer 251 does not cause a substantial influence on the region 210a of the semiconductor device 2a.

In some embodiments, the semiconductor device 2a includes a dielectric layer 254. The dielectric layer 254 is conformally disposed on the stressor layer 253. The dielectric layer 254 includes dielectric materials, such as silicon oxide, silicon nitride, silicon oxynitride, or other dielectric materials.

In some embodiments, the semiconductor device 2a includes one or more contacts 261a. The contact 261a is configured to act upon the electric field generated by the gate structure 220-1. The contact 261a may be configured to change distribution of the electric field generated by the gate structure 220-1 in the drift region 212, which enhances the internal electric field of the drift region 212 and increases the drift doping concentration of the drift region 212, thereby enhancing the breakdown voltage capability of the semiconductor device 2a.

In some embodiments, the contact 261a is disposed on the region 210a of the substrate 210. In some embodiments, the contact 261a is disposed over the drift region 212 of the substrate 210. In some embodiments, the contact 261a penetrates the dielectric layer 254. In some embodiments, the contact 261a penetrates a portion of the stressor structure 250. In some embodiments, the contact 261a penetrates the stressor layer 253. In some embodiments, the contact 261 penetrates the buffer layer 252. In some embodiments, the gate structure 220-1 does not vertically overlap the contact 261a. In some embodiments, the spacer (e.g., 222-1 and/or 224-1) does not vertically overlap the contact 261a.

In some embodiments, the semiconductor device 2a includes contacts 262-1, 263-1, and 264-1. The contact 262-1 is electrically connected to the gate structure 220-1. The contact 263-1 is electrically connected to the doped region 233. The contact 264-1 is electrically connected to the doped region 234.

In some embodiments, the semiconductor device 2a includes contacts 262-2, 263-2, and 264-2. The contact 262-2 is electrically connected to the gate structure 220-2. The contact 263-2 is electrically connected to the doped region 236. The contact 264-2 is electrically connected to the doped region 237.

In some embodiments, the semiconductor device 2a includes a dielectric layer 270. The dielectric layer 270 is disposed on the substrate 210. The dielectric layer 270 includes silicon oxide, carbon-containing oxide such as silicon oxycarbide (SiOC), silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials. In some embodiments, the dielectric layer 270 may include low-k dielectric material with a dielectric constant lower than 4, or extreme low-k (ELK) dielectric material with a dielectric constant lower than 2.5. In some embodiments, the low-k material includes a polymer based material, such as benzocyclobutene (BCB); or a silicon dioxide based material, such as hydrogen silsesquioxane (HSQ) or SiOF. The dielectric layer 270 may be a single layer structure or a multi-layer structure. The dielectric layer 270 can also be referred to as an interlayer dielectric (ILD).

In some embodiments, a profile of the bottom of the contact 261a is different from that of the contacts 262-1, 262-2, 263-1, 263-2, 264-1 and/or 264-2. For example, the contact 261a may have a portion 2611 tapered toward the substrate 210. In some embodiments, the surface area of the bottom surface of the contact 261a is different from that of the contact 262-1, 262-2, 263-1, 263-2, 264-1 or 264-2. In some embodiments, the surface area of the bottom surface of the contact 261a is less than that of the contact 262-1, 262-2, 263-1, 263-2, 264-1 or 264-2.

Figure 2B:
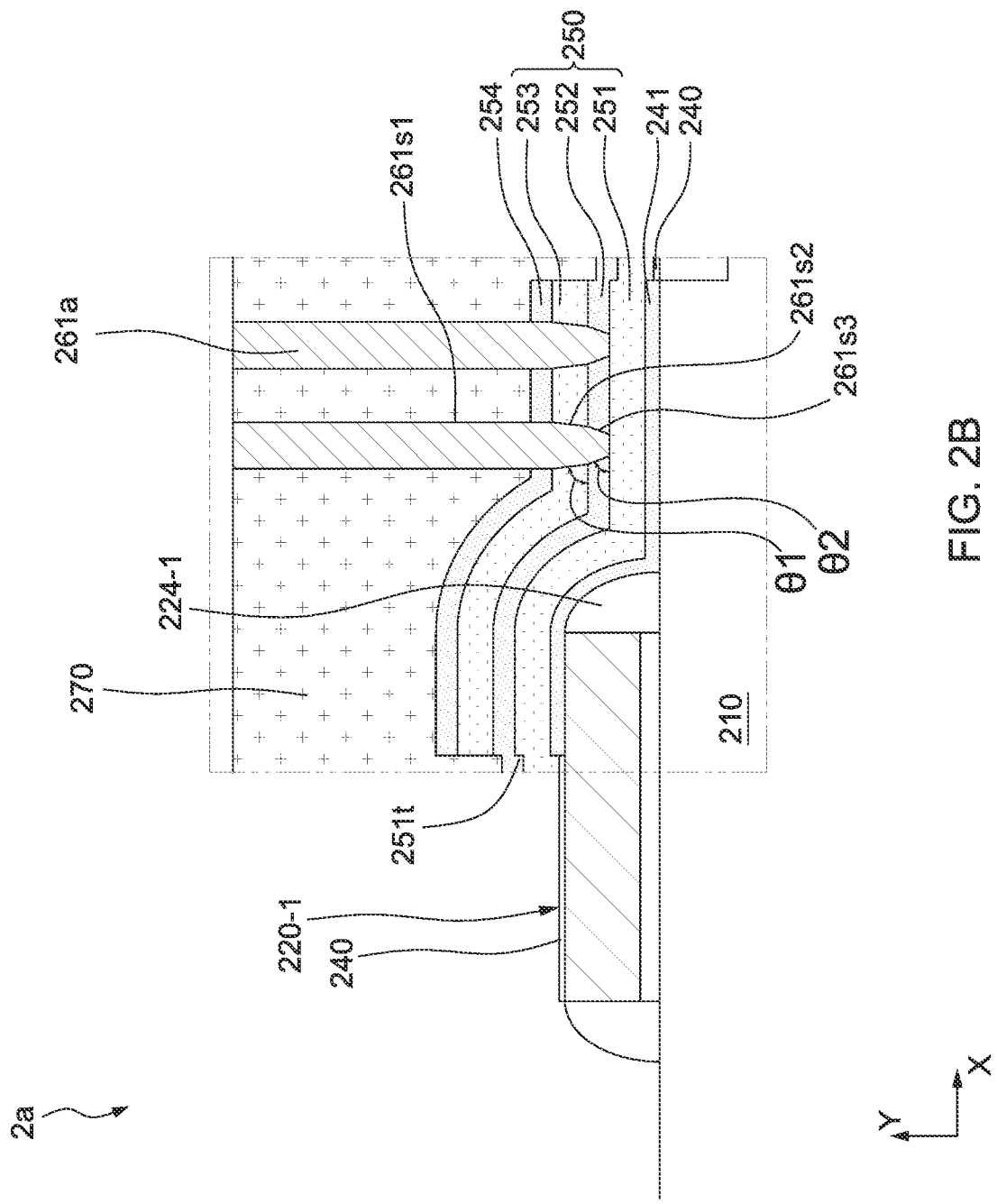
FIG. 2B is a partial enlarged view of the semiconductor device as shown in FIG. 2A, in accordance with some embodiments of the present disclosure.

FIG. 2B is a partial enlarged view of the semiconductor device as shown in FIG. 2A, in accordance with some embodiments of the present disclosure.

In some embodiments, the contact 261a penetrates the buffer layer 252. In some embodiments, the contact 261a abuts a top surface of the stressor layer 251. In some embodiments, the portion 2611 of the contact 261a extends between the buffer layer 252 and the stressor layer 253. The contact 261a has surfaces $261s1$, $261s2$, and $261s3$. The surface $261s1$ of the contact 261a abuts the dielectric layer 270. The surface $261s2$ of the contact 261a abuts the stressor layer 253. The surface $261s3$ of the contact 261a abuts the buffer layer 252. In some embodiments, the surface $261s1$ is noncoplanar with the surface $261s2$. In some embodiments, the surface $261s2$ is noncoplanar with the surface $261s3$. In some embodiments, the surface $261s1$ is steeper than the surface $261s2$. In some embodiments, the surface $261s2$ is steeper than the surface $261s3$. In some embodiments, the angle $\theta1$ defined by the surface $261s2$ and a horizontal axis (e.g., X-axis) ranges from about 83° to about 87°. In some embodiments, the angle $\theta2$ defined by the surface $261s3$ and a horizontal axis (e.g., X-axis) ranges from about 78° to about 85°.

Figure 3:
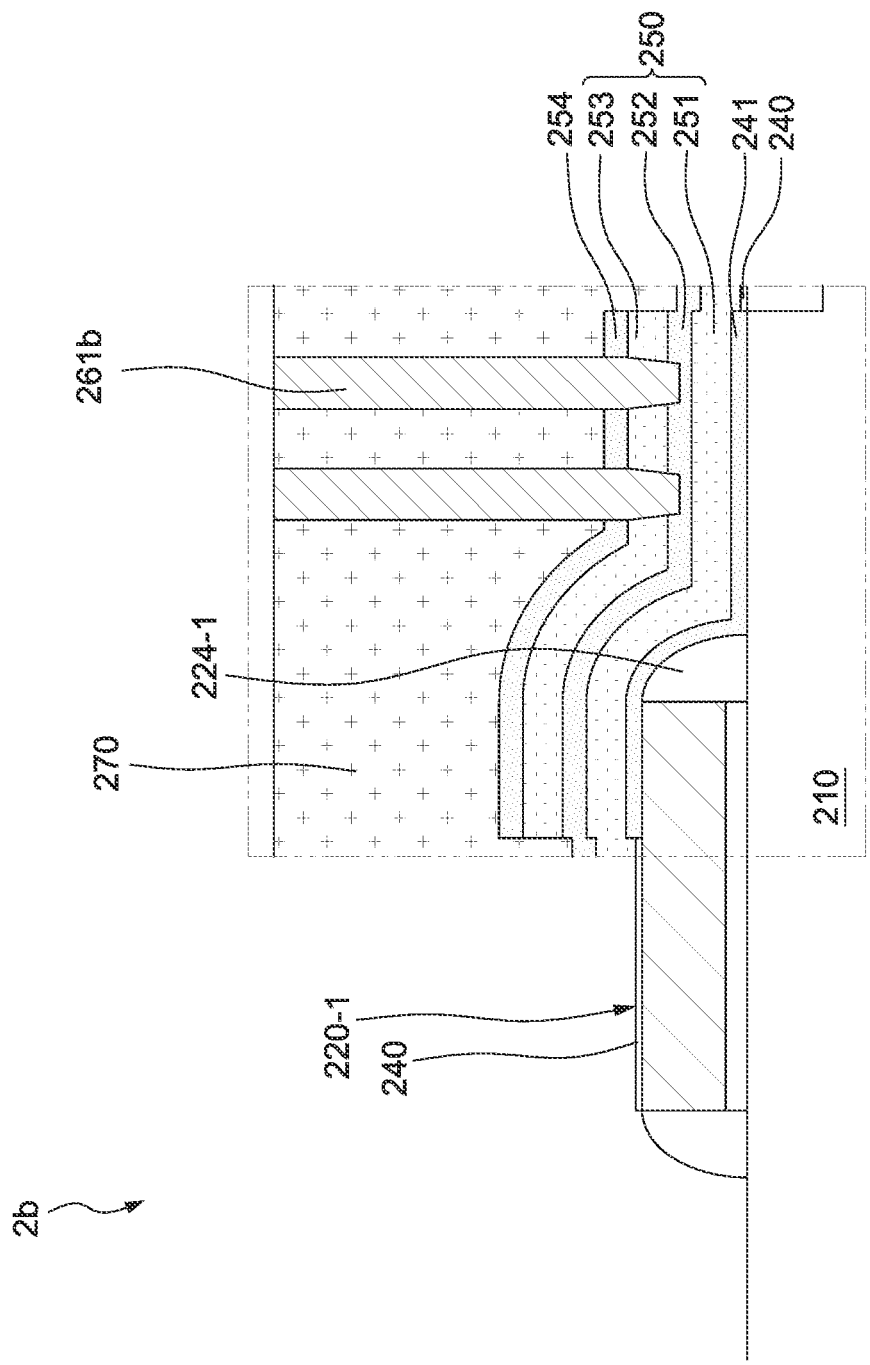
FIG. 3 illustrates a cross-sectional view of a semiconductor device, in accordance with some embodiments of the present disclosure.

FIG. 3 illustrates a cross-sectional view of a semiconductor device 2b, in accordance with some embodiments of the present disclosure. In some embodiments, the semiconductor device 2b has a structure similar to that of the semiconductor device 2a, and one of the differences between them is that the semiconductor device 2b includes one or more contacts 261b. In some embodiments, the contact 261b is spaced apart from the stressor layer 251 by the buffer layer 252.

Figure 4:
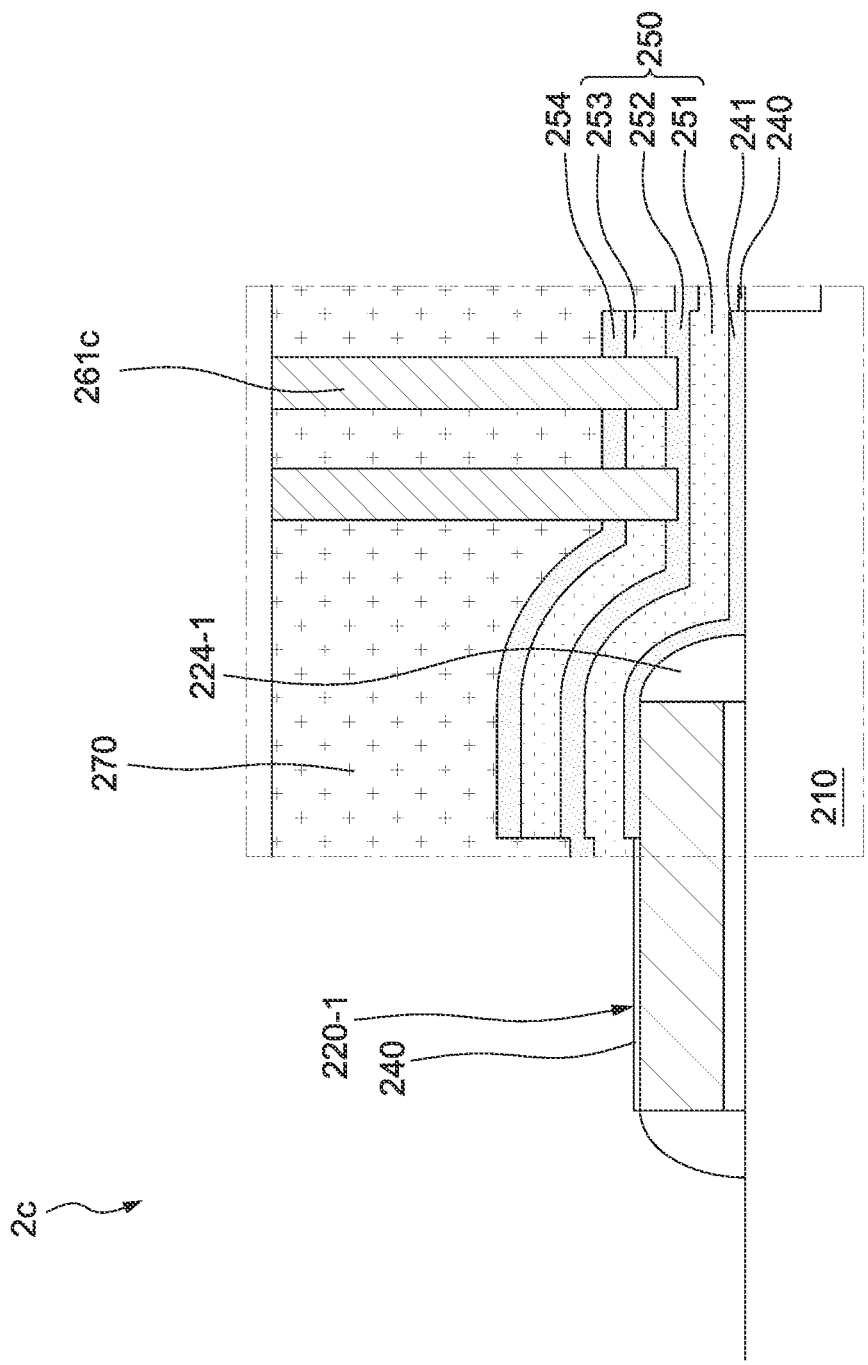
FIG. 4 illustrates a cross-sectional view of a semiconductor device, in accordance with some embodiments of the present disclosure.

FIG. 4 illustrates a cross-sectional view of a semiconductor device 2c, in accordance with some embodiments of the present disclosure. In some embodiments, the semiconductor device 2c has a structure similar to that of the semiconductor device 2a, and one of the differences between them is that the semiconductor device 2c includes one or more contacts 261c. In some embodiments, the contact 261c has a substantially uniform width. The lateral surface of the contact 261c abutting the dielectric layer 270 is substantially coplanar with that abutting the stressor layer 253. The lateral surface of the contact 261c abutting the stressor layer 253 is substantially coplanar with that abutting the buffer layer 252.

Figure 5:
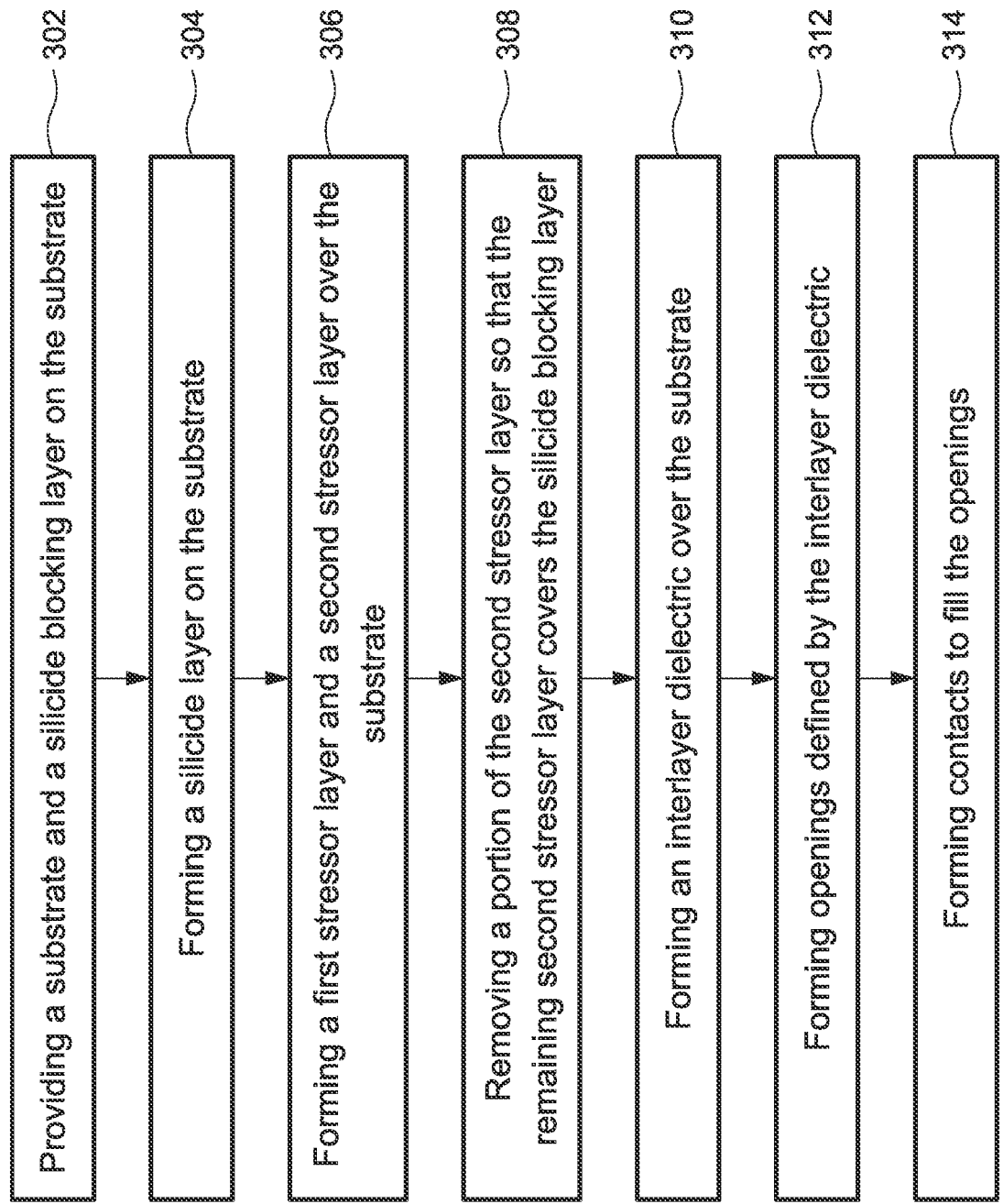
FIG. 5 is a flow chart illustrating a method for manufacturing a semiconductor device according to various aspects of the present disclosure.

FIG. 5 is a flow chart illustrating a method 3 for manufacturing a semiconductor device according to various aspects of the present disclosure.

The method 3 begins with operation 302 in which a substrate is provided. The substrate has a first region and a second region. A silicide blocking layer is formed on the first region of the substrate.

The method 3 continues with operation 304 in which a silicide layer is formed on an exposed region of the substrate.

The method 3 continues with operation 306 in which a first stressor layer and a second stressor layer are formed over the first region and the second region of the substrate.

The method 3 continues with operation 308 in which a portion of the second stressor layer is removed. The remaining portion of the second stressor layer covers a drift region of the first region of the substrate.

The method 3 continues with operation 310 in which an interlayer dielectric is formed to cover the first region and the second region of the substrate.

The method 3 continues with operation 312 in which openings are formed to penetrate the interlayer dielectric, the second stressor layer, and/or the first stressor layer.

The method 3 continues with operation 314 in which contacts are formed to fill the openings, which thereby produces a semiconductor device.

The method 3 is merely an example, and is not intended to limit the present disclosure beyond what is explicitly recited in the claims. Additional operations can be provided before, during, and after the method 3, and some operations described can be replaced, eliminated, or moved around for additional embodiments of the method.

FIG. 6A, FIG. 6B, FIG. 6C, FIG. 6D, FIG. 6E, FIG. 6F, and FIG. 6G illustrate various stages of manufacturing a semiconductor device 2a, in accordance with some embodiments of the present disclosure.

Figure 6A:
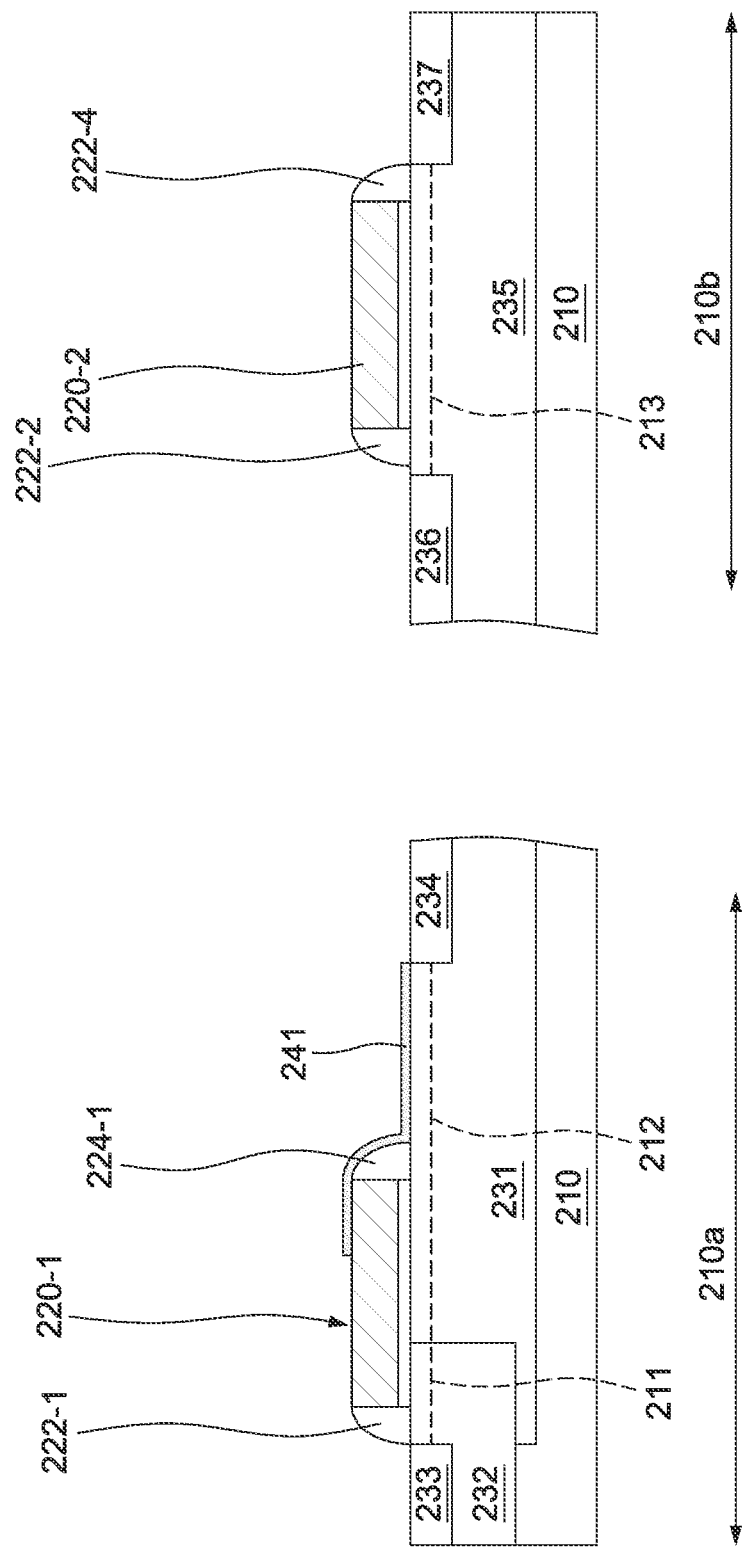
FIG. 6A, FIG. 6B, FIG. 6C, FIG. 6D, FIG. 6E, FIG. 6F, and FIG. 6G illustrate various stages of manufacturing a semiconductor device, in accordance with some embodiments of the present disclosure.

As shown in FIG. 6A, a substrate 210 is provided. The substrate 210 has a region 210a and a region 210b. Gate structures 220-1 and 220-2 are formed on the region 210a and the region 210b, respectively, of the substrate 210. Spacers 222-1 and 224-1 are formed on opposite sides of the gate structure 220-1. Spacers 222-2 and 224-2 are formed on opposite sides of the gate structure 220-2. The substrate 210 may be selectively implanted to form well regions 231, 232, and 235 as well as doped regions 233, 234, 236, and 237. The plurality of implantation regions may be formed by selectively masking the substrate 210 (e.g., using a photoresist mask) and then introducing dopants (e.g., p-type dopant species such as boron or n-type dopants such as phosphorous) into exposed areas of the substrate 210, thereby forming the well regions 231, 232, and 235 as well as the doped regions 233, 234, 236, and 237. Further, a channel region 211 and a drift region 212 are defined within the region 210a of the substrate 210, and a channel region 213 is defined within the region 210b of the substrate 210. A silicide blocking layer 241 is formed on the region 210a of the substrate 210. The silicide blocking layer 241 covers a portion of the gate structure 220-1. The silicide blocking layer 241 may be patterned to define an area on which a silicide layer is formed.

Figure 6B:
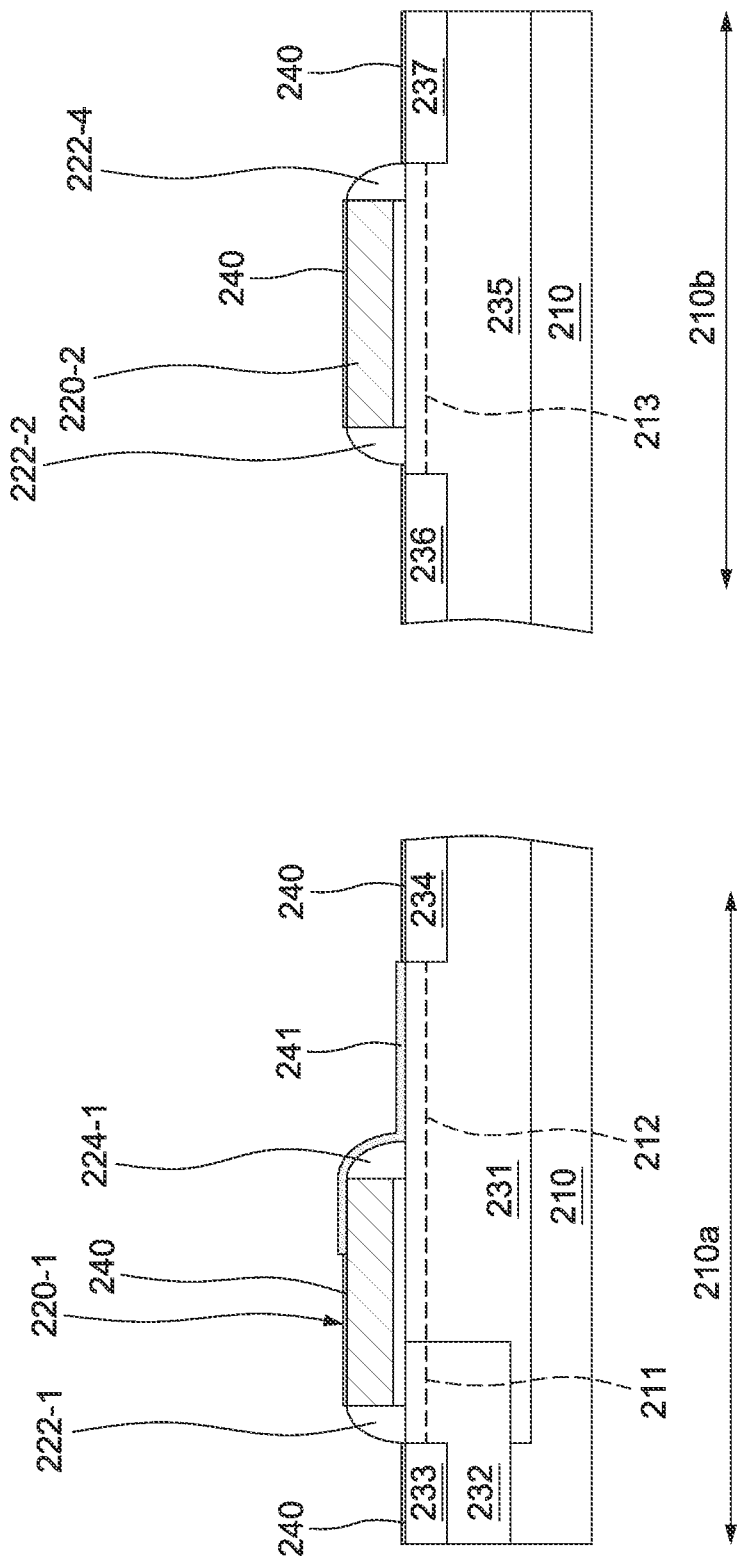

As shown in FIG. 6B, a silicide layer 240 is formed on the top surface of the substrate 210 as well as the top surfaces of the gate structures 220-1 and 220-2 that are exposed by the silicide blocking layer 241. A metal layer may be deposited and then react with silicon to form the silicide layer 240. The unreacted portion of the metal layer may be removed. The metal layer includes, but is not limited to, nickel, platinum or titanium.

Figure 6C:
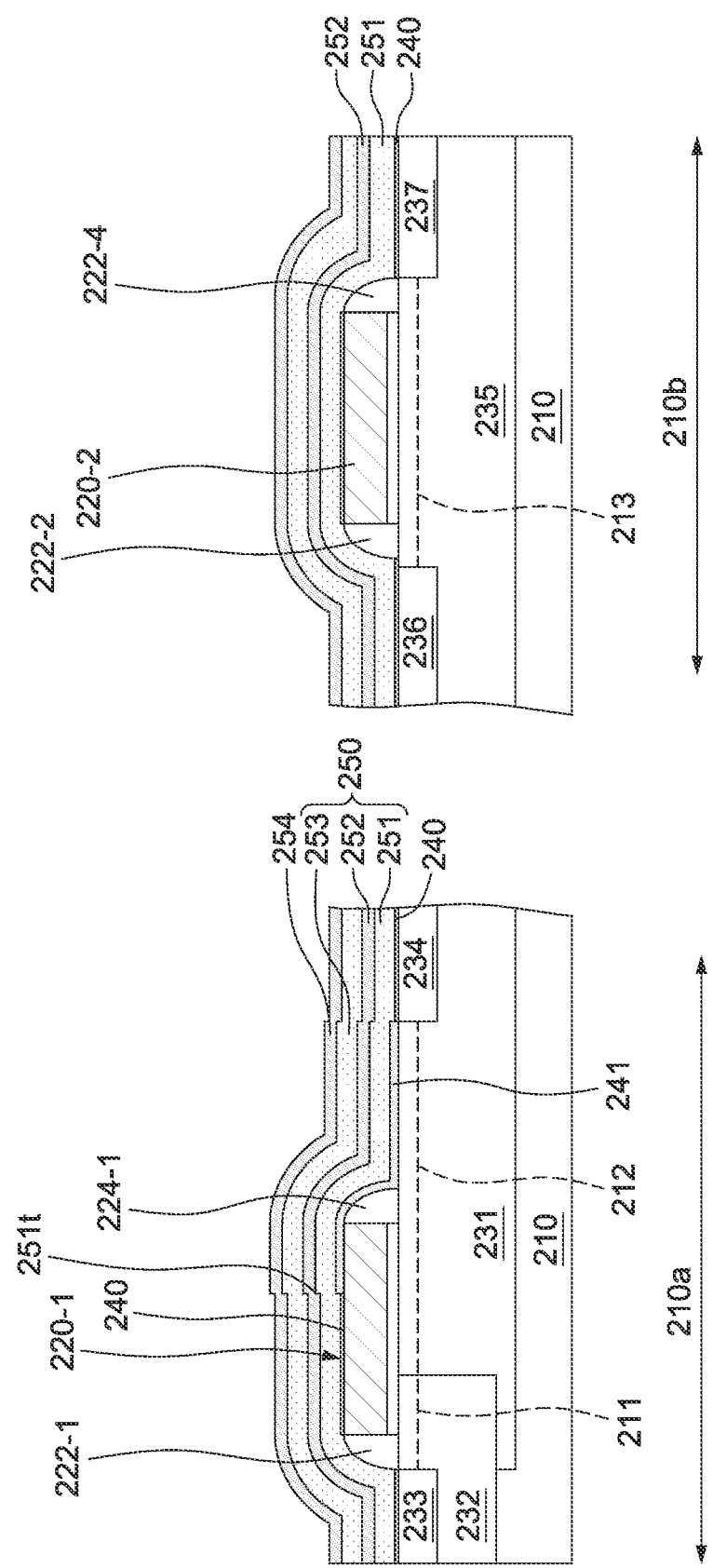

As shown in FIG. 6C, a stressor layer 251, a buffer layer 252, a stressor layer 253, and a dielectric layer 254 are formed in sequence to cover the silicide layer 240 and the silicide blocking layer 241. Each of the stressor layer 251, buffer layer 252, stressor layer 253, and dielectric layer 254 may be formed by a vapor deposition technique, such as chemical vapor deposition (CVD), physical vapor deposition (PVD), atomic layer deposition (ALD), and other suitable techniques.

Figure 6D:
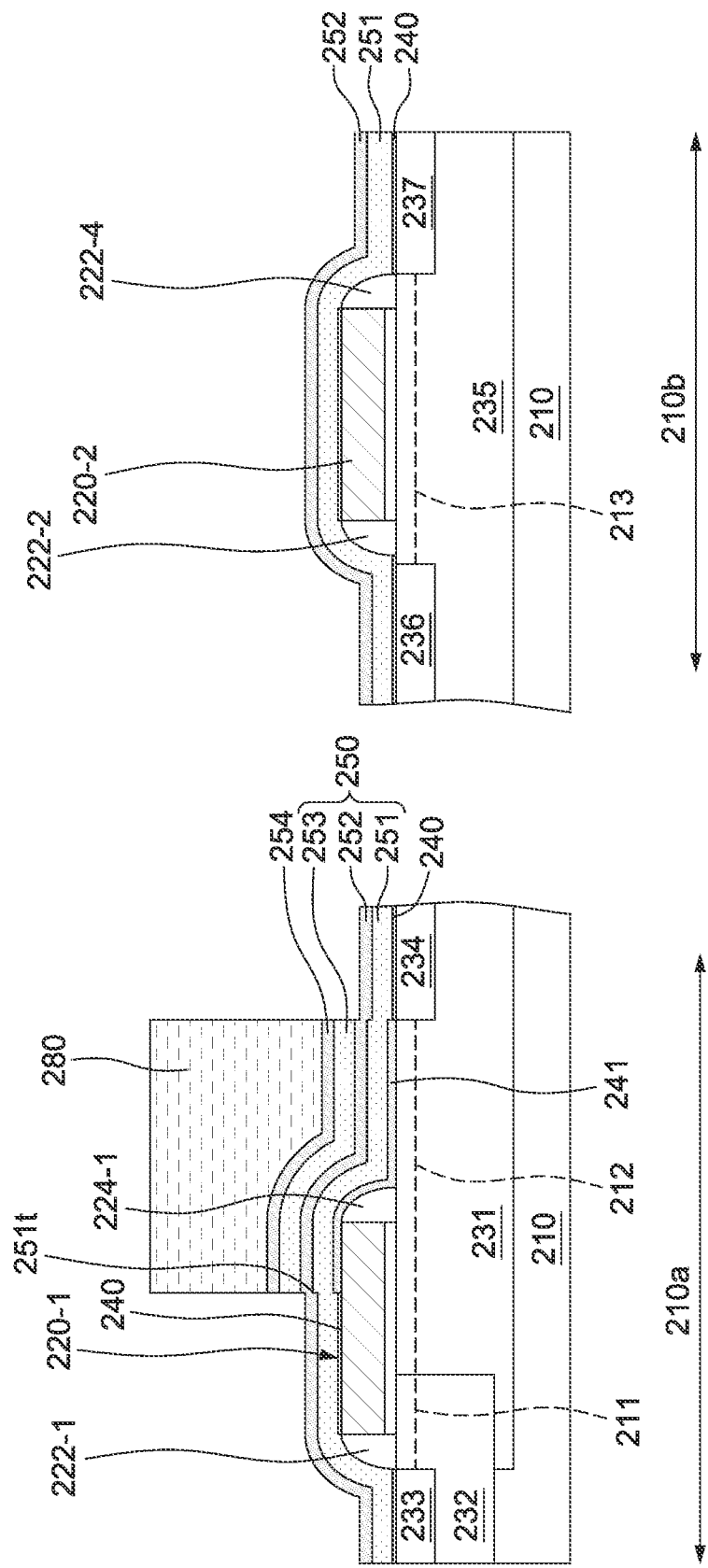

As shown in FIG. 6D, a mask 280 is formed and patterned to cover a portion of the dielectric layer 254. A portion of the gate structure 220-1 is covered by the mask 280. A portion of the substrate 210 is covered by the mask 280. A portion of the drift region 212 of the substrate 210 is covered by the mask 280. The mask 280 may include, for example, a photoresist mask. In some embodiments, an etching technique is performed to remove a portion of the stressor layer 253 and a portion of dielectric layer 254 that are exposed by the mask 280. As a result, the buffer layer 252 is exposed by the mask 280. Further, a portion of the stressor layer 253 and a portion of the dielectric layer 254 remain on a portion of the gate structure 220-1 and on a portion of the drift region 212 of the substrate 210.

Figure 6E:
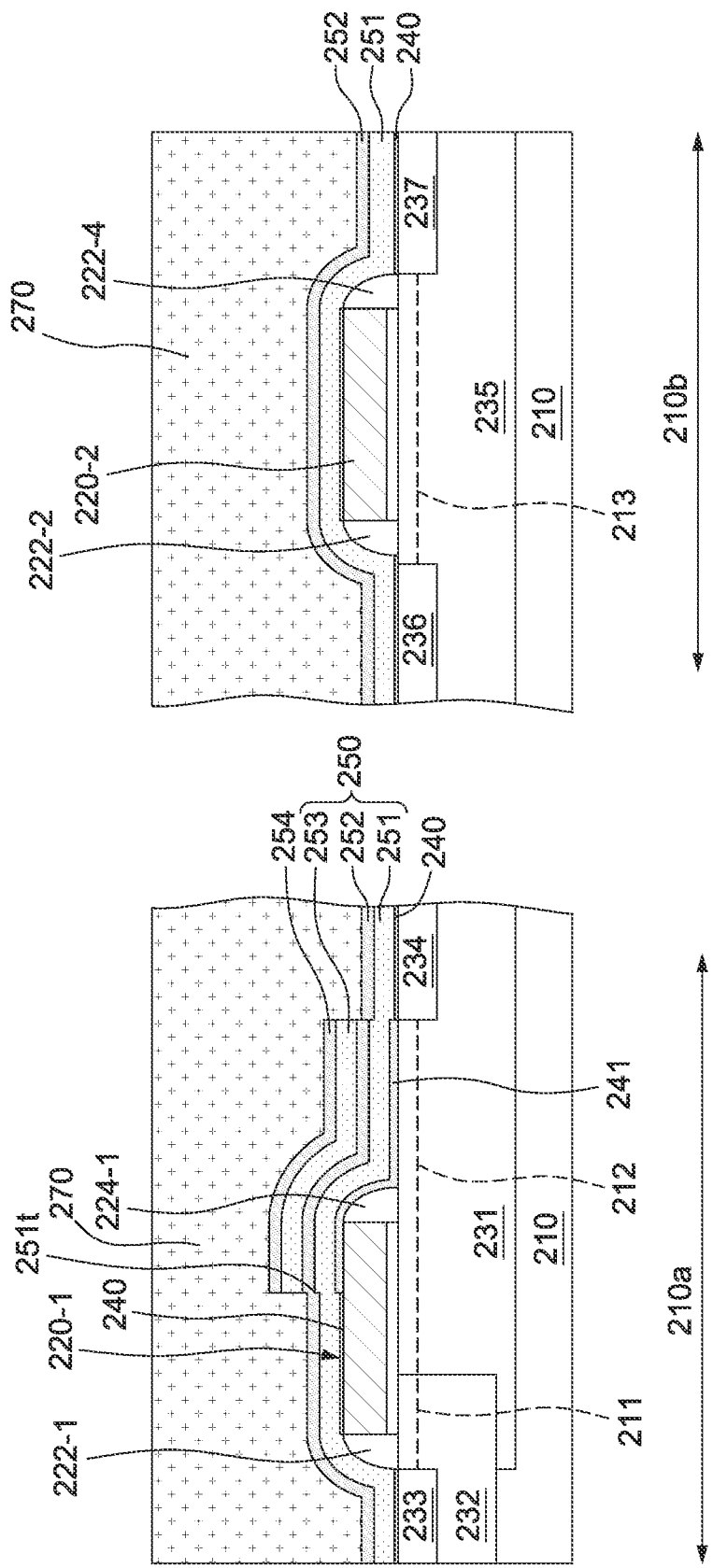

As shown in FIG. 6E, the mask 280 is removed. A dielectric layer 270 is formed to cover the buffer layer 252 and the dielectric layer 254. The dielectric layer 270 is formed by a vapor deposition technique, such as CVD, PVD, ALD, and other suitable techniques.

Figure 6F:
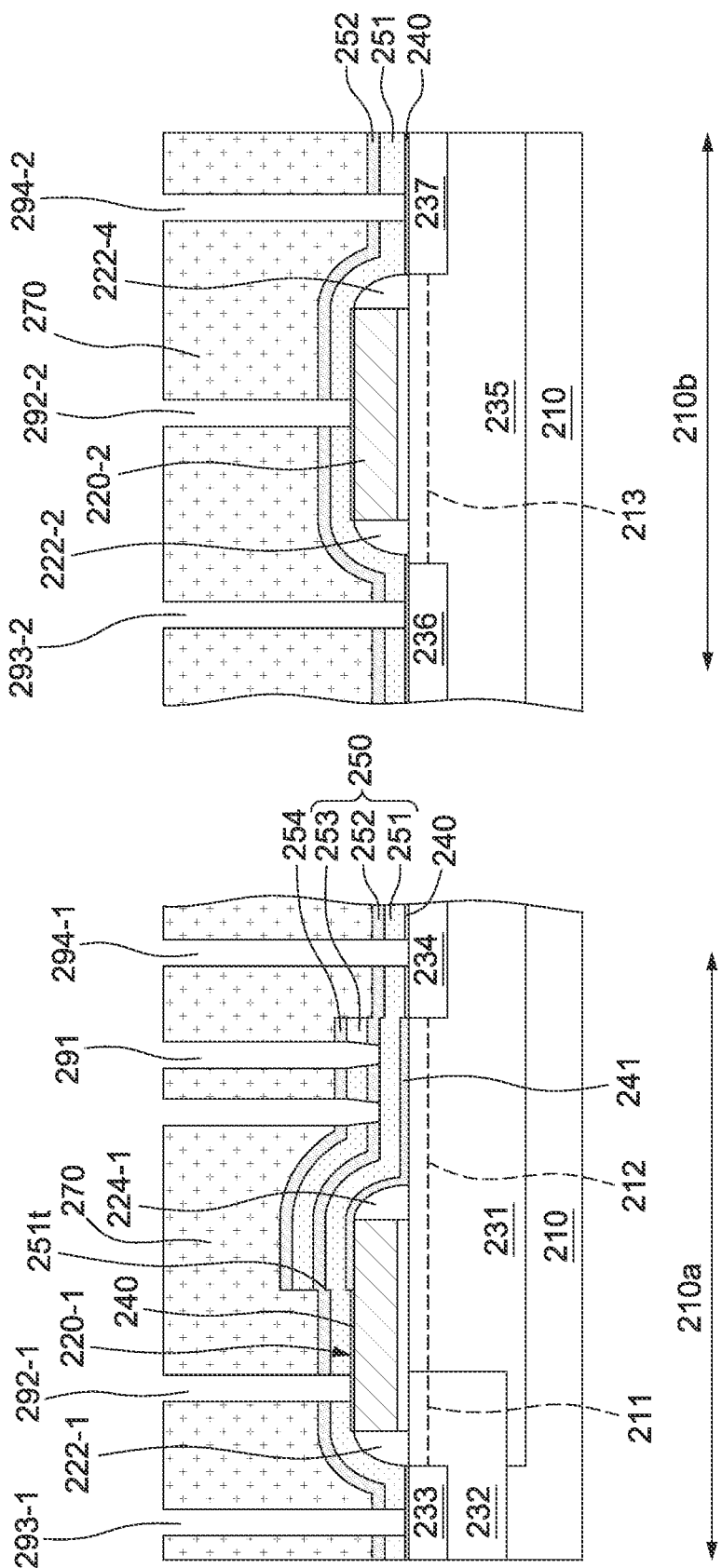

As shown in FIG. 6F, an etching technique is performed to define a plurality of openings 291, 292-1, 292-2, 293-1, 293-2, 294-1, and 294-2. Each of the openings 292-1, 292-2, 293-1, 293-2, 294-1, and 294-2 fully penetrates the stressor layer 251 and the buffer layer 252 so that the silicide layer 240 is exposed. The opening 291 penetrates the stressor layer 253 and a portion of the buffer layer 252. In this embodiment, the buffer layer 252 may serve as an etching stop layer such that the opening 291 may substantially terminate at the buffer layer 252.

Figure 6G:
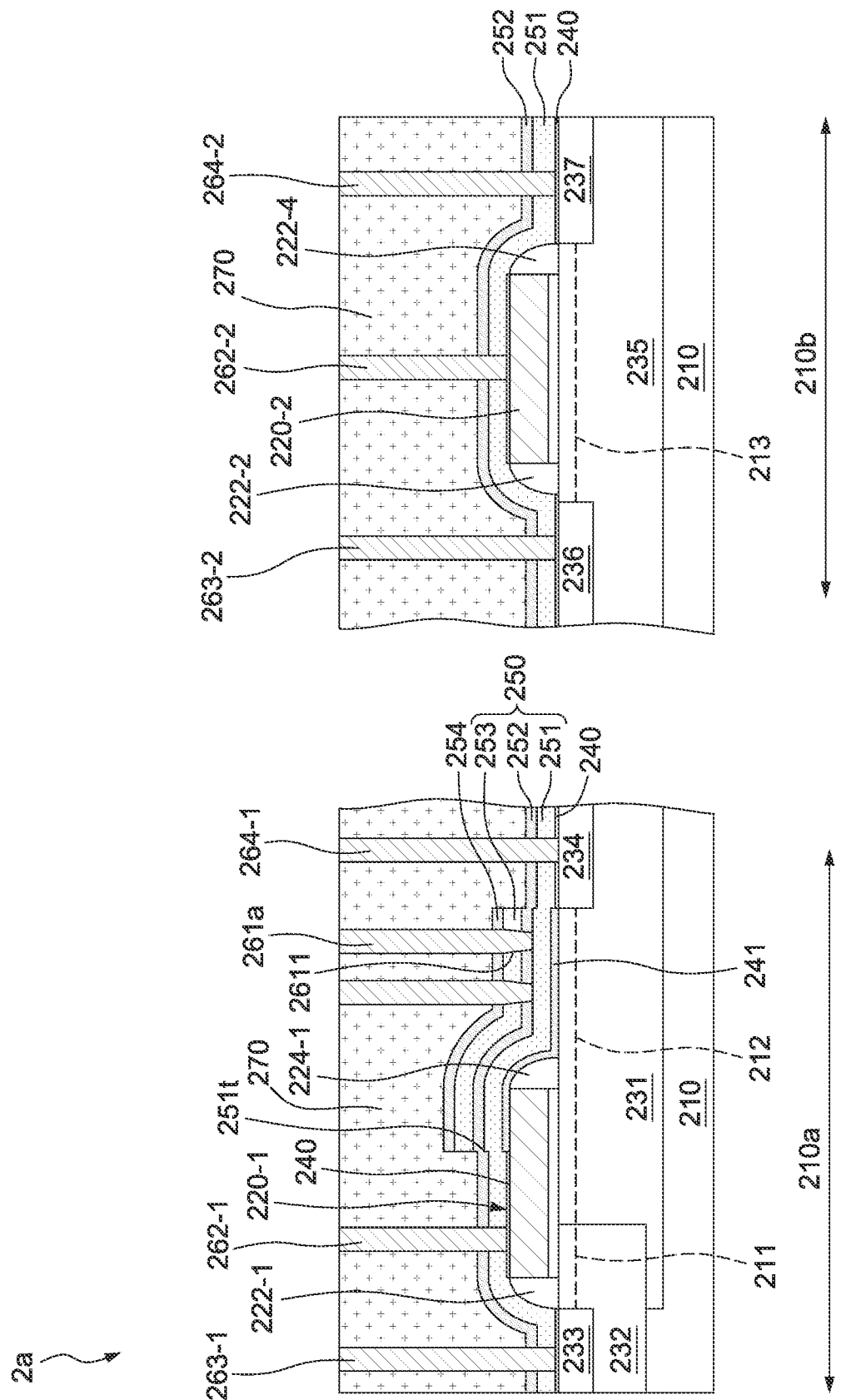

As shown in FIG. 6G, a conductive material is deposited to fill the openings 291, 292-1, 292-2, 293-1, 293-2, 294-1, and 294-2, thereby forming contacts 261a, 262-1, 262-2, 263-1, 263-2, 264-1, and 264-2. As a result, a semiconductor device, such as the semiconductor device 2a as shown in FIG. 2A, is produced.

In this embodiment, the stressor layers 251 and 253 are formed to control, modify, and/or adjust the mobility of carriers within the drift region 212. Further, the manufacturing processes of the formation of the stressor layers 251 and 253 can be applied to both the LDMOS device region (e.g., 210a) and the logic device region (e.g., 210b) without affecting electrical properties of the semiconductor device 2a.

Some embodiments of the present disclosure provide a semiconductor device. The semiconductor device includes a substrate and a gate structure disposed on the substrate. The semiconductor device also includes a source region and a drain region disposed within the substrate. The substrate includes a drift region laterally extending between the source region and the drain region. The semiconductor device further includes a first stressor layer disposed over the drift region of the substrate. The first stressor layer is configured to apply a first stress to the drift region of the substrate. In addition, the semiconductor device includes a second stressor layer disposed on the first stressor layer. The second stressor layer is configured to apply a second stress to the drift region of the substrate, and the first stress is opposite to the second stress.

Some embodiments of the present disclosure provide a semiconductor device. The semiconductor device includes a substrate. The substrate has a first region and a second region. The substrate has a drift region laterally extending between a first source region and a first drain region within the first region. The substrate has a channel region extending between a second source region and a second drain region within the second region. The semiconductor device also includes a first stressor layer covering the drift region of the first region of the substrate. The first stressor layer is configured to apply a first stress to the drift region of the substrate, wherein the first stressor layer further covers the channel region of the second region.

Some embodiments of the present disclosure provide a method of manufacturing a semiconductor device. The method includes providing a substrate. The method also includes forming a gate structure on the substrate. The method further includes forming a source region and a drain region within the substrate. A drift region laterally extends between the source region and the drain region. In addition, the method also includes forming a first stressor layer on the drift region of the substrate. The first stressor layer is configured to apply a first stress to the drift region of the substrate. The method further includes forming a second stressor layer on the first stressor layer. The second stressor layer is configured to apply a second stress to the drift region of the substrate, and the first stress is opposite to the second stress.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising: a substrate; a gate structure disposed on the substrate; a source region and a drain region disposed within the substrate, wherein the substrate comprises a drift region laterally extending between the source region and the drain region; a first stressor layer disposed over the drift region of the substrate, wherein the first stressor layer is configured to apply a first stress to the drift region of the substrate; a second stressor layer disposed on the first stressor layer, wherein the second stressor layer is configured to apply a second stress to the drift region of the substrate, and the first stress is opposite to the second stress; a first contact, that changes distribution of an electric field generated by the gate structure, penetrating the second stressor layer; and a second contact electrically connected to the source region, wherein a profile of a bottom of the first contact is different from a profile of a bottom of the second contact.

2. The semiconductor device of claim 1, further comprising:
a buffer layer disposed between the first stressor layer and the second stressor layer.

3. The semiconductor device of claim 1, wherein the first stressor layer has a stepped structure over the gate structure.

4. The semiconductor device of claim 1, wherein the first stressor is configured to apply a tensile stress to the drift region of the substrate, and the second stress is configured to apply a compressive stress to the drift region of the substrate.

5. The semiconductor device of claim 1, wherein a density of the first stressor layer is different from a density of the second stressor layer.

6. The semiconductor device of claim 1, wherein the first contact is spaced apart from the substrate.

7. The semiconductor device of claim 1, wherein the first contact is spaced apart from the first stressor layer.

8. The semiconductor device of claim 1, wherein the first contact has a portion tapered toward the substrate.

9. The semiconductor device of claim 1, wherein a first dielectric layer disposed over the second stressor layer, a second dielectric layer disposed on the first dielectric layer, and a lateral surface of the first contact abutting the second dielectric layer is substantially coplanar with a lateral surface of the first contact abutting the first dielectric layer.

10. The semiconductor device of claim 1, wherein the first stressor layer covers the source region.

11. The semiconductor device of claim 10, wherein the second stressor layer is free from vertically overlapping the source region.

12. A semiconductor device, comprising: a substrate having a first region and a second region, wherein the substrate has a drift region laterally extending between a first source region and a first drain region within the first region, and the substrate has a channel region extending between a second source region and a second drain region within the second region; a gate structure disposed on the substrate; a first stressor layer covers the drift region of the first region of the substrate, wherein the first stressor layer is configured to apply a first stress to the drift region of the substrate, wherein the first stressor layer further covers the channel region of the second region; a first contact, that changes distribution of an electric field generated by the gate structure, disposed over the first region of the substrate; and a second contact disposed over the second region of the substrate, wherein the first contact is spaced apart from the first stressor layer, and the second contact penetrates the first stressor layer.

13. The semiconductor device of claim 12, further comprising:
a second stressor layer disposed on the first stressor layer, wherein the second stressor layer is configured to apply a second stress to the drift region of the substrate, and the second stressor layer is free from vertically overlapping the channel region of the second region.

14. The semiconductor device of claim 13, wherein the first stress is opposite to the second stress.

15. The semiconductor device of claim 13, further comprising:
a buffer layer disposed between the first stressor layer and the second stressor layer.

16. The semiconductor device of claim 13, wherein a density of the first stressor layer is different from a density of the second stressor layer.

17. A semiconductor device, comprising: a substrate; a gate structure disposed on the substrate; a first source/drain region within the substrate and having a first conductive type; a well region surrounding the first source/drain region and having the first conductive type; a first stressor layer covering the well region, wherein the first stressor layer is configured to apply a first stress to the substrate; a second stressor layer disposed on the first stressor layer, wherein the second stressor layer is configured to apply a second stress to the substrate, and the first stress is opposite to the second stress; a buffer layer disposed between the first stressor layer and the second stressor layer, a first dielectric layer disposed over the second stressor layer; a first contact penetrates the first dielectric layer, the second stressor layer, and the buffer layer, wherein the first contact is spaced apart from the first stressor layer by the buffer layer.

18. The semiconductor device of claim 17, wherein the first stressor layer has a stepped structure over the gate structure.

19. The semiconductor device of claim 17, further comprising: the first contact has two surfaces, a first surface and a second surface, wherein the first surface abuts the first dielectric layer and the second surface abuts the second stressor and the buffer layer.

20. The semiconductor device of claim 17, a second dielectric layer disposed on the first dielectric layer, wherein a lateral surface of the first contact abutting the second dielectric layer is substantially coplanar with the first surface abutting the first dielectric layer.

* * * * *